United States Patent [19]
Watanabe

[11] Patent Number: 5,537,433
[45] Date of Patent: Jul. 16, 1996

[54] SEMICONDUCTOR LIGHT EMITTER

[75] Inventor: Masanori Watanabe, Nara, Japan

[73] Assignee: Sharp Kabushiki Kaisha, Osaka, Japan

[21] Appl. No.: 278,178

[22] Filed: Jul. 21, 1994

[30] Foreign Application Priority Data

| Jul. 22, 1993 | [JP] | Japan | 5-181039 |
| Jun. 10, 1994 | [JP] | Japan | 6-128767 |
| Jun. 28, 1994 | [JP] | Japan | 6-146487 |

[51] Int. Cl.$^6$ .............................. H01S 3/18; H01L 33/00
[52] U.S. Cl. ................... 372/45; 372/43; 257/98
[58] Field of Search ................... 372/45, 43, 44; 257/98

[56] References Cited

U.S. PATENT DOCUMENTS

| 4,563,764 | 1/1986 | Kuroda et al. | 372/45 |
| 4,590,501 | 5/1986 | Scholl | 257/94 |
| 4,766,470 | 8/1988 | Scholl et al. | 372/45 |
| 4,779,280 | 10/1988 | Sermage et al. | 372/45 |
| 4,990,970 | 2/1991 | Fuller | 257/98 |
| 5,319,219 | 6/1994 | Cheng et al. | 372/45 |
| 5,363,395 | 11/1994 | Gaines et al. | 372/45 |

FOREIGN PATENT DOCUMENTS

| 0247267 | 12/1987 | European Pat. Off. |
| 57-49284 | 3/1982 | Japan . |
| 60-77473 | 5/1985 | Japan . |
| 2-125670 | 5/1990 | Japan . |
| 2-170486 | 7/1990 | Japan . |
| 3-114277 | 5/1991 | Japan . |
| 3-163882 | 7/1991 | Japan . |
| 4-290275 | 10/1992 | Japan . |
| 85/03809 | 8/1985 | WIPO . |

OTHER PUBLICATIONS

Dialog™ English Patent Abstract of Japanese Laid-Open Patent Publication No. 57-49284 (Mar. 23, 1982) (2 pages total).

*Primary Examiner*—Rodney B. Bovernick
*Assistant Examiner*—Robert McNutt
*Attorney, Agent, or Firm*—Morrison & Foerster

[57] ABSTRACT

A semiconductor light emitter, such as the light-emitting diode or the semiconductor laser, having a structure in which a light emitting area or an active layer; a transparent layer which is pervious to light radiated from the light emitting area or the active layer; and an opaque layer or an opaque substrate which is impervious to the radiated light are arranged in order or in the inverse order. The semiconductor light emitter includes (a) total reflection layer(s) arranged between the transparent layer(s) and the opaque layer(s) so as to come into contact with the transparent layer. The refractive index of the total reflection layer is smaller than that of the transparent layer. Therefore, at least one part of light, which has been radiated from the light emitting area or the active layer and which has been reflected by the total reflection layer thereafter, is either radiated outward from side surfaces of the transparent layer or returned to the active layer.

1 Claim, 10 Drawing Sheets

SEMICONDUCTOR LIGHT EMITTER

BACKGROUND OF THE INVENTION

1. Field of the Invention

This invention relates to a reflection layer of a semiconductor light emitter, and more particularly, to a high effective total reflection layer of a semiconductor light emitter which is utilized for a light-emitting diode, a semiconductor laser and so on.

2. Description of the Prior Art

In the semiconductor light emitter, such as the light-emitting diode (LED), the semiconductor laser etc., it is very important to extract light from inside effectively, in other words, to improve an outer radiative efficiency, from a point of obtaining a semiconductor light-emitter of high power and efficiency.

Particularly, in case of using a substrate absorbing a radiative wavelength, it has been devised a countermeasure to prevent the substrate from absorbing the light by a provision of a reflecting layer between the substrate and a light-emitting section, since the light absorption in the substrate may be one of factors to reduce the outer radiative efficiency of the semiconductor light emitter.

As an example of the prior art, FIG. 1, shows a cross-sectional view of an LED having a multi-layer reflection film arranged on an opaque substrate, thereby emitting the light from an upper surface of the LED. This emitter is produced as follows; on the whole surface of an n-type GaAs substrate 510, n-type AlInP/AlGaInP multi-layer reflection layers 511 (layer thickness: 0.041 μm(AlInP); 0.040 μm(AlGaInP), 20 pairs), an n-type AlGaInP cladding layer 512, an undoped AlGaInP emitting layer 513, a p-type AlGaInP cladding layer 514 and a p-type GaAs contact layer 515 are fabricated in order.

Thereafter, a surface electrode 516 is deposited on a surface of the LED and then the electrode 516 and the p-type GaAs contact layer 515 are etched except a central portion of the LED. Further, a back surface electrode 517 is also deposited on a back surface of the LED.

In the above LED, however, since the multi-layer reflection film affords high reflectivity for only light in a specific incident direction, i.e., a vertical incident light in this case, there is caused a problem that, although a beam p traveling straight downward is reflected by the multi-layer reflection film to radiate upward, a beam q traveling downward obliquely is absorbed by the multi-layer reflection film so that it does not contribute to the outward radiation.

Further, since the multi-layer reflection film reflects mainly the light traveling straight downward, the light is radiated through the upper surface of the LED chip, so that the amount of light radiated through the side surfaces of the chip is remarkably small. Such a fact is inconvenient for applying a simple mounting method of the chip described hereinafter.

We now describe a method disclosed in Japanese Patent Application Laid-Open Sho 57 No. 49284 as a simple method to mount the LED on a printed board directly without wire-bonding. As shown in FIG. 2A, in the above method, a p-type semiconductor layer 718 is fabricated on an n-type semiconductor substrate 719 to form an electrode 721 on an upper surface of the LED chip, which radiates the light in the vicinity of a pn junction surface 720, and an electrode 723 on a lower surface thereof. Thereafter, solder layers 732 are plated on both electrodes, respectively. On the other hand, as a printed board to mount the LED chip thereon, there is prepared a printed board as shown FIG. 2B where wirings 728 (over two areas) for the respective electrodes are printed on an insulator substrate 729 to form a solder resist film 733 and an adhesive agent 731 is painted thereon. Then, seating the above LED chip on the substrate and heating the solder layers 732 for at first melting and subsequently resolidifying, solders 730 connecting the electrode wirings 728, 728 to the LED electrodes 721 and 722 can be completed, respectively. In this way, by arranging the chip laterally on the board and then fixing it thereon, the light can be radiated from the side surfaces of the chip.

The above-mentioned mounting method presupposes a extracting up of a great deal of light from the side surfaces of the chip. Therefore, it is not practical to apply the above mounting method for a conventional LED using a multi-layer reflection film on a light absorbing substrate.

On the other hand, it is very important to reduce a threshold current in the semiconductor laser to obtain a high efficiency of converting current to light. In the prior art, Japanese Patent Application Laid-Open Hei 2 No. 170486 discloses a semiconductor laser intended to reduce the threshold current, or to improve the current/light converting efficiency by returning spontaneous emission, which emits in an active layer and does not contribute to an oscillation of the laser, to the active layer (photon recycle). FIG. 3 shows a cross-sectional view of this semiconductor laser.

The semiconductor laser is manufactured as follows: at first, by superimposing an n-type $Al_{0.2}Ga_{0.8}As$ layer of a thickness $\lambda/4n$(n: refractive index of medium) on an n-type AlAs layer of a thickness $\lambda/4n$ by turns with 10 cycles by means of MOCVD (metal organic chemical vapor deposition) method, an n-type multi-layer reflection film 902 is fabricated on a n-type GaAs substrate 901. Then, after forming a n-type $Al_{0.3}Ga_{0.7}As$ cladding layer 903, a GaAs active layer 904 and a p-type $Al_{0.3}Ga_{0.7}As$ cladding layer 905 in order, p-type $Al_{0.2}Ga_{0.8}As$ layers and p-type AlAs layers are mutually laminated to have $\lambda/4n$ in thickness, respectively, with 10 cycles, whereby a p-type multi-layer reflection film 906 is formed and then a p-type GaAs cap layer 907 is overlaid thereon. Next, after forming a mesa-stripe by etching, a p-type $Al_{0.6}Ga_{0.4}As$ buried layer 908 and a n-type AlGaAs buried layer 909 are provided by LPE method (Liquid Phase Epitaxy). Then, a Zn diffusion area 910 is formed by selective diffusion and a p-electrode 911 and a n-electrode 912 are provided. Then the semiconductor laser is completed to be of 100 μm in oscillator length by cleavage.

In the above semiconductor laser, however, since the multi-layer reflection film affords high reflectivity for limited light in a specific incident direction (a vertical incident light in case of $\lambda/4n$ in layer thickness), there is risen a problem that, although a beam traveling from the active layer 904 to the multi-layer reflection film 902 or 906 is reflected by the multi-layer reflection film to contribute to the photon recycle, an incident beam oblique to the multi-layer reflection film is so absorbed that it does not contribute to the outward radiation.

Furthermore, since the semiconductor laser needs high accuracy in thickness of each layer of the multi-layer film, it is difficult to manufacture. Again, because of many boundaries between different kinds of semiconductors, the semiconductor laser is apt to have an increased resistance.

SUMMARY OF THE INVENTION

Bearing the above-mentioned problems in mind, the first object of the present invention is to provide a semiconductor light emitter intended to increase the outside radiative efficiency or the current utilization efficiency by employing a reflection layer with a simple construction to reflect the incident light oblique to the reflection layer.

The second object of the present invention is to provide either a light-emitting diode (LED), which is capable of extracting the light from side surfaces of the chip.

In order to solve the above-mentioned objects, according to the first object of the present invention, there is provided a semiconductor light emitter having a structure in which a light-emitting area or an active layer; a transparent layer which is pervious to light radiated from the light emitting area or the active layer; and an opaque layer or an opaque substrate which is impervious to the radiated light are arranged in order or in the inverse order, comprising:

a total reflection layer arranged between the transparent layer and the opaque layer so as to come into contact with the transparent layer, a refractive index of the total reflection layer being smaller than that of the transparent layer;

wherein at least one part of light which has been radiated from the light-emitting area or the active layer and which has been reflected by the total reflection layer thereafter, is either radiated outward from side surface of the transparent layer or returned to the active layer.

Furthermore, according to the second object of the present invention, there is also provided a semiconductor light emitter having a structure including a light-emitting area or an active layer; a first transparent light-pervious layer which is pervious to light radiated from the light-emitting area or the active layer; and a first opaque layer or an opaque substrate which is impervious to the radiated light, are arranged in order; under the light-emitting area or the active layer, a second transparent layer which is pervious to light radiated from the light-emitting area or the active layer; and a second opaque layer or an opaque substrate which is impervious to the radiated light, are arranged in order, over the light-emitting area or the active layer, the semiconductor light emitter comprising:

a first total reflection layer arranged between the first transparent layer and the first opaque layer so as to come into contact with the first transparent layer, a refractive index of the first total reflection layer being smaller than that of the transparent layer; and a second total reflection layer arranged between the second transparent layer and the second opaque layer so as to come into contact with the second transparent layer, a refractive index of the second total reflection layer being smaller than that of the transparent layer;

wherein at least one part of light which has been radiated from the light-emitting area or the active layer and which has been reflected by the first or second total reflection layer thereafter, is either radiated outward from side surfaces of the first or second transparent layer or returned to the active layer.

In the first object of the present invention, any of the following features is preferable: the product of the layer thickness and the refractive index of the total reflection layer is more than 1.41 times as much as a center light-emitting wavelength of the semiconductor light emitter; the transparent layer consists of AlGaAs or AlGaInP and the total reflection layer consists of any one of AlAs, AlGaAs, AlInP and AlGaInP, of which refractive indexes are lower than that of the transparent layer, respectively; the transparent layer consists of any one of ZnSe, ZnSSe and ZnMgSSe and the total reflection layer consists of any one of ZnCdS, ZnCdSSe and ZnMgSSe, of which refractive indexes are lower than that of the transparent layer, respectively; the semiconductor light emitter is a light-emitting diode; and the semiconductor light emitter is a semiconductor laser.

Further, in case that the semiconductor light emitter is the light-emitting diode, any of the following features is preferable: i.e., the transparent layer consists of GaAsP and the total reflection layer consists of any one of GaP, GaAsP and AlGaAs, of which refractive indexes are lower than that of the transparent layer, respectively; the transparent layer consists of either GaN or AlGaInN and the total reflection layer consists of AlGaInN of which refractive index is lower than that of the transparent layer; a protection film is formed on side surfaces of the transparent layer; and a first and a second electrodes are formed on the top and bottom surfaces of the substrate and the light-emitting diode is arranged so that the respective surfaces of the first and the second electrodes are roughly perpendicular to surfaces of a first and a second electrodes formed on a top and bottom surfaces of the light-emitting diode, respectively, and the first electrode of the printed board is electrically connected with the first electrode of the light emitting diode and the second electrode of the printed board is electrically connected with the second electrode of the light-emitting diode.

Next, the operation of the invention with reference to drawings is described. FIG. 4 is a schematic cross-sectional view of the semiconductor light emitter, showing the principle of the invention. In the figure, it is presumed that a refractive index of a medium 1 in the light-incident side is 3.527; the refraction index of the total reflection layer 2 is 3.189, lower than the refractive index of the medium 1; a refractive index of a medium 3 is a value in a range of 4.066–0.276i; where i is the imaginary unit, and that the incident angle of the light from the medium 1 through the medium 2 is expressed to the angle A. FIG. 5 shows a variation of a reflectivity R calculated in response to the changes of thickness d of the reflection layer 2 under the conditions of 50° and 66° on the above angle A. Note that, the wavelength $\lambda$ of the light is 0.564 μm.

In the structure shown in FIG. 4, a critical angle Ac at which the incident angle A exhibits the total reflection is 64.7°. Under the condition that the incident angle A is 50° which is below the critical angle, as the layer thickness d is increased, the reflectivity R periodically repeats its rise and fall. Under the condition that the incident angle A is 66° which is over the critical angle, a requirement for total reflection can be satisfied, so that, if the layer thickness d is large enough in comparison with the wavelength $\lambda$, the reflectivity R can be 100%. On the contrary, when the layer thickness d is small in comparison with the wavelength $\lambda$, the reflectivity R is so small that it cannot exceed 50% unless the layer thickness d is about 0.25 μm and that the reflectivity R of nearly 100% cannot be attained unless the layer thickness d is more than about 1 μm.

This means that even though the incident angle A satisfies the condition of A>Ac, there exists a flow-out of the light called "evanescent wave" in the total reflection layer, so that the layer thickness d thereof has to be larger than the distance of the flow-out in order to obtain the sufficient reflectivity.

Now, we define the medium 2 as the total reflection layer by the reflectivity of more than 50%. As described above, although a lower limit in the layer thickness of the total reflection layer is 0.25 μm, it varies in response to the wavelength. Converting the above thickness to a light path length (i.e. the product of refractive index and layer thickness), the length corresponds to 1.41 times (=3.189×0.25 μm/0.564 μm) the wavelength, whereby such a value is applicable independent of the wavelength.

This lower limit in the layer thickness of the total reflection layer is considerably large in comparison with the layer thickness of low refractive index in the conventional multi-layer reflection film. The layer thickness of $\lambda/4n$ (n: refractive index) is given as that of the low refractive index layer in the conventional multi-layer reflection film, which corresponds to 0.25 times the wavelength in the above light path length. Comparing with this value, the light path length of the total reflection layer exceeds 1.41 times the wavelength, so that the ratio therebetween is more than 5.6 times at least. Consequently, it is understood that the multi-layer reflection film is quite different from the total reflection layer in terms of the operational principle, since the former employs the Bragg reflection while the latter employs the total reflection.

Now, a case of radiating the light from side surface 4 of the semiconductor light emitter by utilizing the total reflection layer is studied, with reference to FIG. 4. Note that, through this study, it is assumed that the side surface 4 is perpendicular to the total reflection layer 2. An incident angle C to the side surface 4 that the light radiated therefrom has to satisfy, is in a range of $0° < C < Cmax$, where the total reflection critical angle Cmax of the light radiating from the medium 1 to the material 5 (refraction index: 1.5 by assuming a resin) is 25.16° [=arc sin(1.5/3.527)]. By the way, the relationship between the angles C and A is expressed by the equation of $A=90°-C$. Therefore, in order to attain a high reflectivity of the total reflection layer 2 for the light radiating from the side surface, a high reflectivity should be obtained in the angle A of the range of $Amin < A < 90°$, where $Amin=90°-Cmax=64.84°$. This angle is approximately equal to the total reflection critical angle Ac (=64.7°) of the total reflection layer 2 mentioned above.

Therefore, it is understood that there is no need to use the multi-layer reflection film which has been employed conventionally, since the total reflection layer 2 can reflect most of the light radiating from the side surface 4. Of course, since the angle depends on the difference in the refractivity between the medium 1 and the total reflection layer 2 greatly, the multi-layer reflection film can be used together in connection with the utilized combination of the medium 1 and the total reflection layers 2. It is expected that the suitable multi-layer reflection film to be combined is ones which exhibits a high reflectivity against the vertical incident light radiating toward the top surface, besides the layers which exhibits a high reflectivity against the oblique incident light so as to secure the reflectivity against the light radiating toward the side surface. For the material used for the total reflection layer, it is desirable that not only the refractive index thereof is less than that of the medium on the incident side but also a lattice match can be attained therein. Bearing these points into mind, when the medium on the incident side is AlGaInP, any one of AlGaInP (where, the alloy composition ratio of Al thereof is larger than that of the medium on the incident side), AiInP, AlGaAs and AlAs is appropriate for the material, particularly.

Similarly in case that the medium on the incident side is AlGaAs, any one of AlGaInP, AlInP, AlGaAs (where, the alloy composition ratio of Al thereof is larger than that of the medium on the incident side) and AlAs is appropriate for the material, particularly. Further, in case that the medium on the incident side is ZnSe or ZnSSe, either ZnCdS or ZnMgSSe is appropriate for the material. In case that the medium on the incident side is ZnMgSSe, ZnMgSSe where the alloy composition ratio of Mg or S thereof is larger than that of the medium on the incident side is appropriate for the material. Also, in case that the medium on the incident side is GaAsP, any one of GaP, GaAsP where the alloy composition raio of P thereof is larger than that of the medium on the incident side, and AlGaAs is appropriate for the material, particularly. Again, in case of the medium on the incident side of AlGaInN, AlGaInN where the alloy compound ratio of Al thereof is larger than that of the medium on the incident side or the alloy composition ratio of In is smaller than that of the medium is appropriate.

Note, although the accurate refractive indexes have not been known for all of the above materials, a material of a large bandgap generally has a lower refractive index. Particularly, in the III group elements of the III–V group semiconductors, the larger the material has a composition ratio of the element Ga rather than the element In and furthermore, a composition ratio of the element Al rather than the element Ga, the smaller the refractive index thereof exhibits. Also, in the V group elements, the larger the material has a composition ratio of the element P rather than the element As and furthermore, a composition ratio of the element N rather than the element P, the smaller the refractive index thereof exhibits. Similarly, also in the II group elements of the II–VI group semiconductors, the larger the material has a composition ratio of the element Zn rather than the element Cd and furthermore, a composition ratio of the element Mg rather than the element Cd, the smaller the refractive index thereof exhibits. Alternatively, in the VI group elements, the larger the material has a composition ratio of the element Se rather than the element Te and furthermore, a composition ratio of the element S rather than the element Se, the smaller the refractive index thereof exhibits. Similarly, also in the VI group semiconductors, such as SiC, SiGe etc., the larger the material has a composition ratio of the element Si rather than the element Ge and furthermore, a composition ratio of the element C rather than the element Si, the smaller the refractive index thereof exhibits.

The above-mentioned total reflection layers are suitable for the light-emitter radiating the light from side surfaces thereof. FIG. 6A shows a schematic view in case of radiating the light from the top surface, while FIG. 6B shows a schematic view in case of radiating the light from the side surfaces. Among light radiating from a point P in FIG. 6A, a component of light radiating from the top surface is restricted by the total reflection at the top surface to thereby occupy only a circular area 6. The ratio of the solid angle of the radiative light to the whole solid angle is 5.1%.

On the other hand, as shown in FIG. 6B, the light emitting from a point Q on a central axis of a cylindrical body radiates from an area 7 of a side surface of the cylindrical body taken along two parallel surfaces in the cylindrical body. The ratio of the solid angle of the radiative light to the whole solid angle is 44.1%. In this way, it is understood that the solid angle of the light radiating from the side surface is overwhelmingly larger than that of the light radiating from the top surface.

In order to radiate from the side surface, however, it is necessary to either thicken a transparent area sufficiently or reflect the light incident obliquely on a substrate so that the light beam emitting at a center of the body can reach the side surface without being absorbed by the substrate.

If the above-mentioned total reflection layer is used, it is possible to guide the light beam emitting at a center of the body up to the side surface, without excessively thickening the transparent area. Further, if the above total reflection layer is provided on not only the lower part of the emitting layer but the upper part thereof, it is possible to guide the light, which would travel toward the upper part and which would be absorbed in the vicinity of the electrode, to the side surface.

There is a case that the light reflected by the total reflection layer is absorbed into the light emitting layer again. Different from a case that the light is absorbed into the substrate etc., such a phenomenon can contribute to emitting again. As mentioned before, such an effect is called the photon recycle effect. The photon recycle effect exists in both the light-emitting diode and the semiconductor laser. Particularly, in the semiconductor laser, the threshold current for oscillation can be reduced.

Since the light can be extracted from the side surfaces mainly in this way, the semiconductor light emitter according to the present invention is especially suitable for such an application that the LED chips of the invention are mounted laterally on the printed board. According to this mounting form, since the chips are electrically connected to the printed board without wire-bonding, the process of connecting becomes simple and the reliability of electrical connection can be improved.

On the other hand, since the semiconductor light emitter of the present invention is so constructed as mentioned above, it is also suitable for an application as the semiconductor laser. FIG. 7 shows a schematic diagram of an arrangement of the light radiated from the top surface or the side surface of the semiconductor light emitter employed in the present invention. With reference to FIG. 7, it shall now be described of a fact that the stereographic angle which the oblique light occupies is overwhelmingly larger in comparison with that of the vertical light. The stereographic angle of 0° to θ°, which is shown with G close to the vertical direction, is expressed by the equation:

$$2\pi \int_0^\theta \sin\delta \, d\delta = 2\pi(1 - \cos\theta) \approx 2\pi \theta^2/2$$

where, the above approximate equation is effected when the angle θ is sufficiently smaller than 1.

On the other hand, the stereographic angle of $\pi/2-\theta$ to $\pi/2$, which is shown with H close to the horizontal direction, is expressed by the equation:

$$2\pi \int_{\pi/2-\theta}^{\pi/2} \sin\delta \, d\delta = 2\pi(\sin\theta) \approx 2\pi \theta$$

where, the above approximate equation is effected when the angle θ is sufficiently smaller than 1.

Hereon, it is presumed that the value of θ is less than $\pi/2$. In such a case, the value of the second equation is always larger than that of the first equation and particularly, the difference therebetween becomes significant when the angle θ is smaller than 1. For example, in case of θ of 24°, the stereographic angle shown with G of FIG. 7, which is close to the vertical direction, is 0.543 while the stereographic angle shown with H, which is close to the horizontal direction, is 2.556. It can be seen that the angle of the latter is 4.7 times as large as that of the former. In this way, it will be noted that the stereographic angle close to the vertical direction is larger than the stereographic angle close to the horizontal direction, whereby the total reflection layer having a high reflection ratio against the incident light in the oblique direction is advantageous.

Note that, the effect of the total reflection layer according to the present invention is different from the total reflection at the boundary surface between the active layer and the cladding layer. A normal waveguide of the semiconductor laser guides the light by the total reflection at the boundary surface between the active layer and the cladding layers to thereby attain the laser oscillation. On the contrary, the total reflection layer of the present invention is arranged outside the cladding layer to operate to return the light the active layer to the active layer again. Since the total reflection layer is arranged in the area where the waveguide light does not reach, it is easy to distinguish the total reflection layer from the cladding layer.

DESCRIPTION OF THE PREFERRED EMBODIMENT

Embodiments of semiconductor light emitters in accordance with the present invention are now described in detail with reference to the drawings.

<The First Embodiment>

Figure 1:
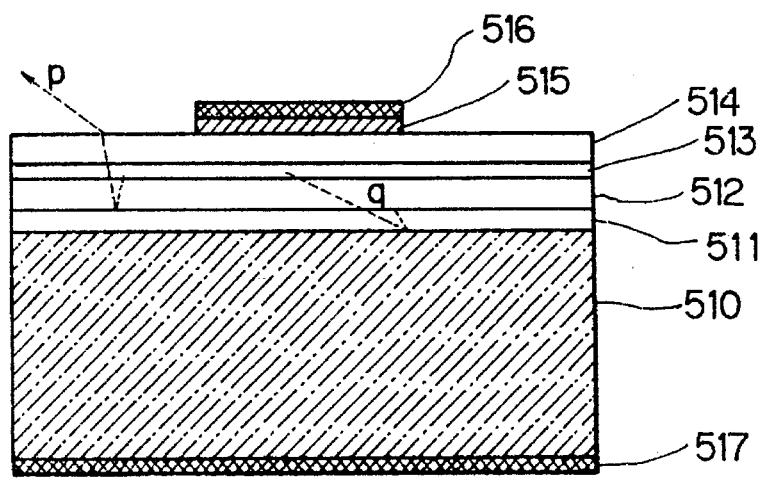
FIG. 1 is a cross-sectional view showing a conventional LED.
Figure 2A:
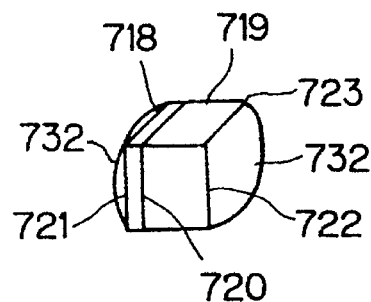
FIG. 2A is a perspective view showing an example of a LED chip used in a conventional lateral mounting method.
Figure 2B:
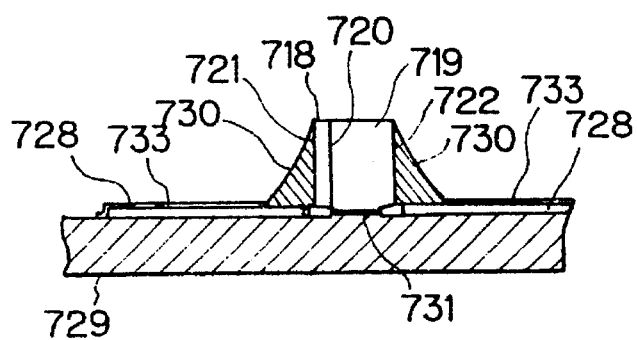
FIG. 2B is a front cross-sectional view of the LED chip of FIG. 2A, to which the lateral mounting method is applied.
Figure 3:
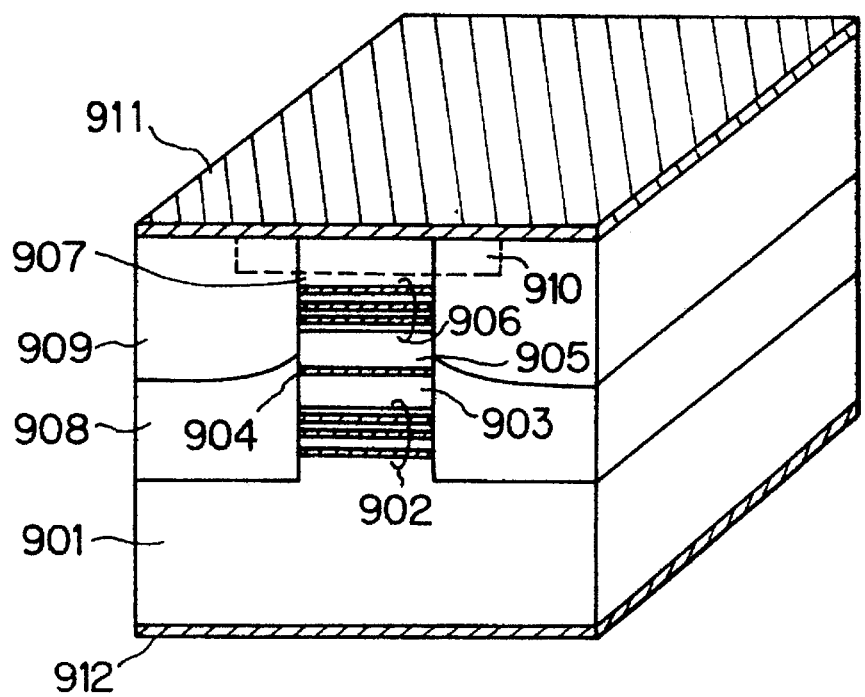
FIG. 3 is a cross-sectional view showing a conventional semiconductor laser.
Figure 4:
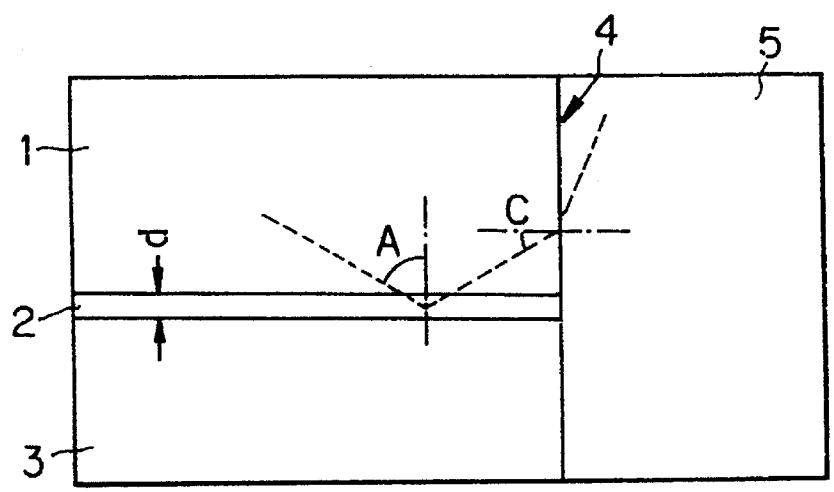
FIG. 4 is a schematic cross-sectional view showing a relationship among a light beam, a side surface and a reflection layer, in order to describe an operation of the present invention.
Figure 5:
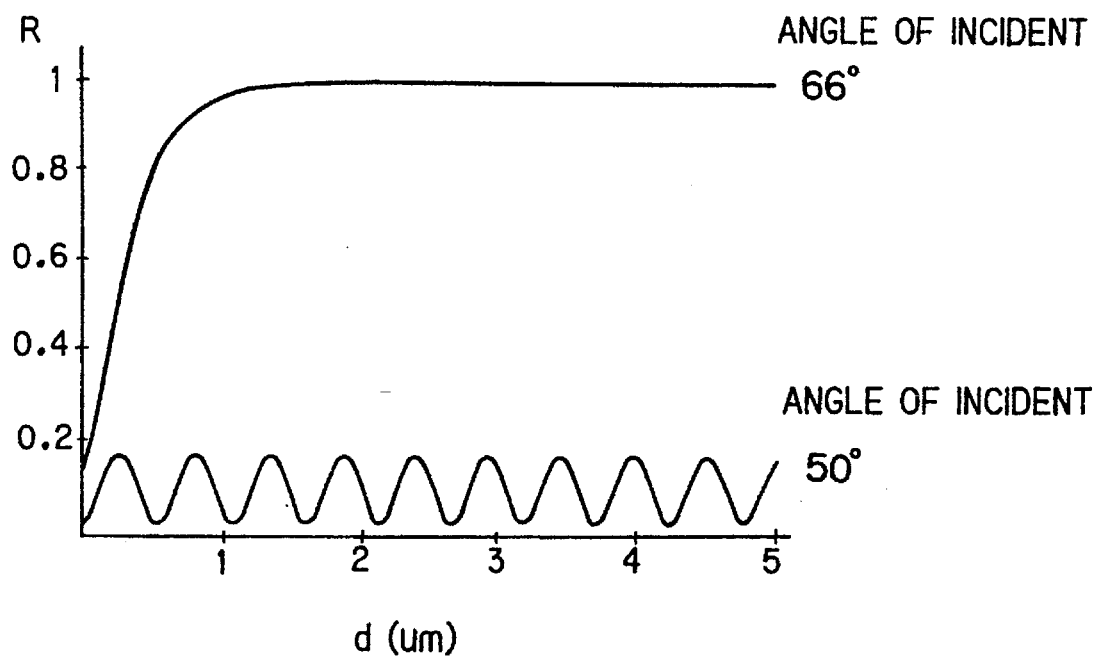
FIG. 5 is a diagram showing a relationship between a reflectivity R and the thickness d of the reflective layer, in order to describe the operation of the present invention.
Figure 6A:
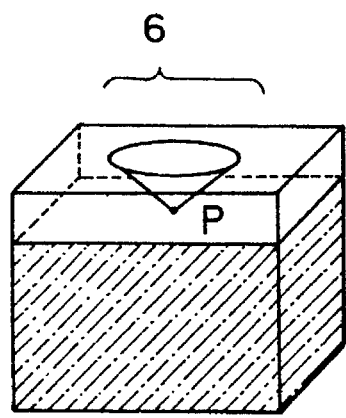
FIG. 6A is a schematic view showing a stereographic angle of a light radiated from an upper surface of an emitter, in order to describe the operation of the present invention.
Figure 6B:
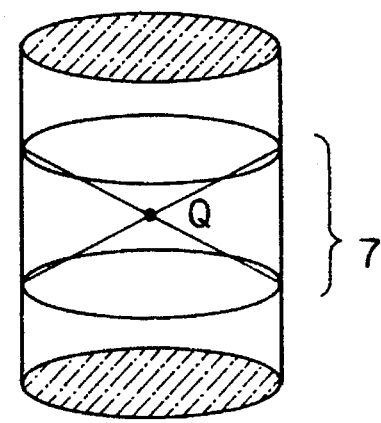
FIG. 6B is a schematic view showing a stereographic angle of a light radiated from a side surface of the emitter, in order to describe the operation of the present invention.
Figure 7:
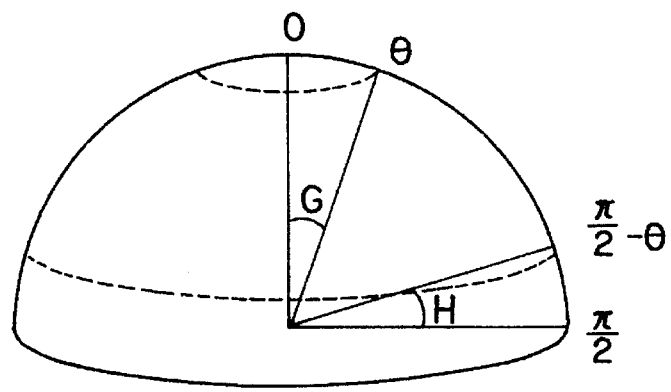
FIG. 7 is a schematic view showing the light radiated from the upper surface or the side surface of the emitter, in order to describe the operation of the present invention.
Figure 8:
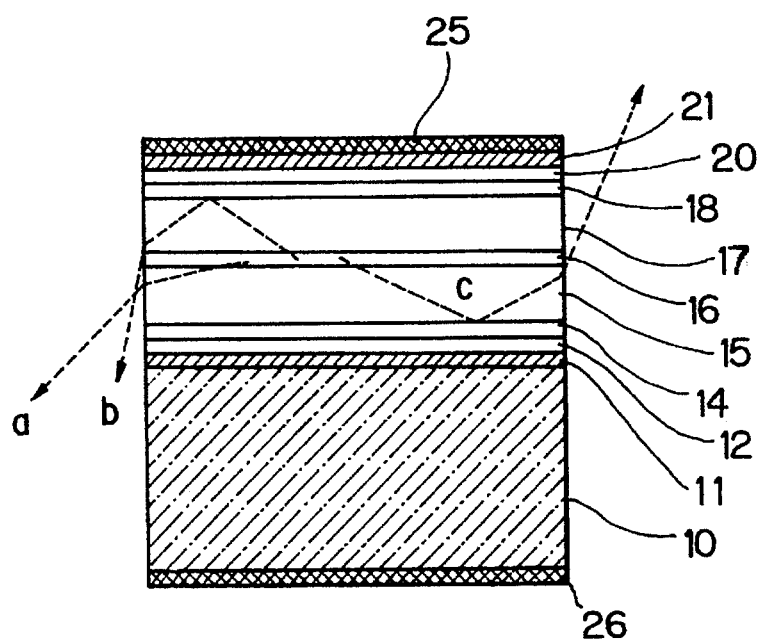
FIG. 8 is a cross-sectional view of a AlGaInP type LED in accordance with the first embodiment of the present invention.

FIG. 8 shows a cross-sectional view of a light emitting diode (LED) of a AlGaInP type thereof in accordance with the first embodiment of the present invention. Note that, in the descriptions hereinafter, each numeral in each parenthesis denotes a thickness of each layer in a direction perpendicular to a surface of substrate. In addition, through the descriptions, an expression GaInP stands for $Ga_{0.5}In_{0.5}P$; AlInP stands for $Al_{0.5}In_{0.5}P$; and AlGaInP stands for $(Al_yGa_{1-y})_{0.5}In_{0.5}P$.

The LED of the AlGaInP type of FIG. 8 is manufactured as follows. By the MOCVD method, an n-type GaAs buffer layer 11(0.5 μm), an n-type $Al_{0.5}Ga_{0.5}As$ intermediate bandgap layer 12(0.2 μm), an n-type AlAs total reflection layer 14(1 μm), an n-type AlGaInP(y=0.7) cladding layer 15(25 μm), an undoped AlGaInP(y=0.5) emitting layer 16(1 μm), a p-type AlGaInP(y=0.7) cladding layer 17(25 μm), a p-type AlAs total reflection layer 18(1 μm), a p-type $Al_{0.5}Ga_{0.5}As$ intermediate bandgap layer 20(0.2 μm) and a p-type GaAs contact layer 21(1 μm) are formed in order on an n-type GaAs substrate 10 of which a top surface consists of a (100) direction plane.

Figure 9:
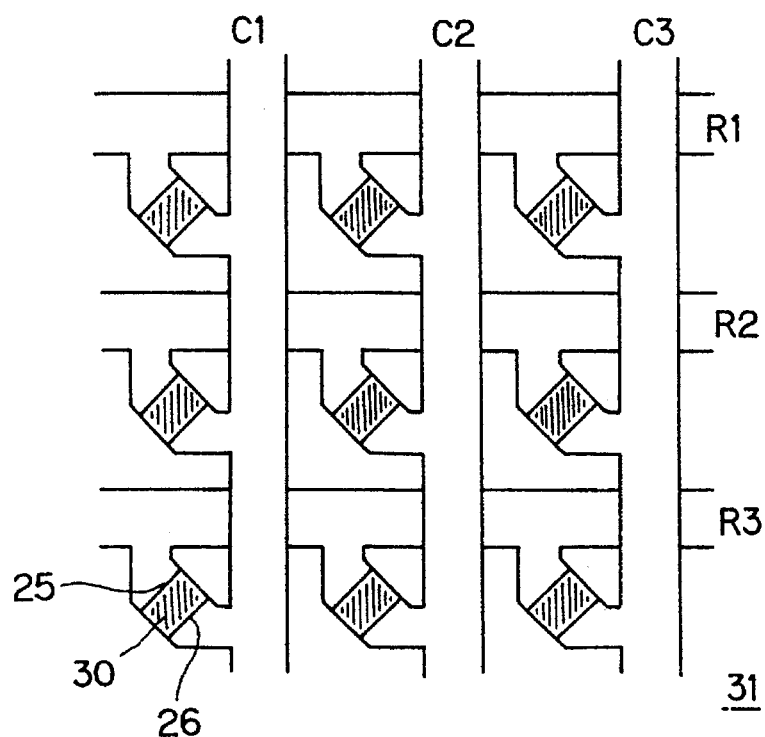
FIG. 9 is a top view in which the LED chips of FIG. 8 are laterally mounted in a matrix pattern.

Next, electrodes 25 and 26 are formed on the top and the bottom surfaces of the above structure, respectively, and thereafter solders(not shown) are attached on both electrodes, the structure is divided into chips at intervals of 140 μm by dicing. As shown in FIG. 9, the respective LED chips are laterally mounted on a printed board 31 on which vertical wirings C1, C2, C3 etc., and lateral wirings R1, R2, R3 etc., are printed in the matrix pattern, in such a manner that each electrode 25 of a plurality of chip 30 is connected to the lateral wiring and each electrode 26 thereof is connected to the vertical wiring. Thereafter, a resin for protection is coated so as to cover the whole printed board.

The LED chips, which are mounted with a high density by the lateral mounting in this way, are convenient to use for a linear or matrix LED light source, a LED display, a light interconnection employing the LEDS and so on, since most of the chips are arranged in a narrow area.

In the light-emitting diode of the present embodiment, a light beam which reaches the side surface directly from the light-emitting layer 16, and light beams b, c which reflect at the total reflection layer 14 or 18 to reach the side surface radiate outside.

In opposition that the typical LED in the prior art has been of 300 μm square in size, the present LED can be of 140 μm square of which size is substantially the same as a pad area required for wire bonding, since it has not a radiating surface on the upper surface thereof. Consequently, the number of LEDS per wafer becomes four times as much as that of the conventional LED, whereby the productivity can be improved dramaticaly.

The LED in accordance with the embodiment emits at 560 nm in the central wavelength and its brightness is about 1.7 times as much as that of the conventional LED of the top-radiation type. This is because the ratio of light radiating toward the side surfaces in front, rear, left and right directions is larger than the ratio of light radiating toward the top surface.

Here, the first embodiment can be modified as follows. As the total reflection layers 14, 18, any one of AlGaAs, AlInP and AlGaInP can be employed instead of AlAs. The layer thickness of each of the total reflection layer more than 0.25 μm is applicable.

The LED chips can be electrically connected to the electrode wiring by a conductive material besides the solder, such as Ag-paste, conductive resin, etc.

Although the LED chips are mounted on the printed board 31 in the shown embodiment, they can be subjected to die bonding with a normal cup-shaped stem and sequent wire bonding. Then, they can be molded in a resin.

Although the electrode of the LED chip is formed on the whole surface of each top and bottom surfaces thereof in the shown embodiment, it is not always necessary to form the electrode all over the surface. That is, a part of the electrode can be eliminated so that the light can radiates partially from the top surface or the bottom surface. In such a case, it is preferable to eliminate also the total reflection layer formed under the electrode to be eliminated so that the cladding layer or the current diffusion layer, which is regarded as a kind of the cladding layer in a broader sense, is brought into contact with the outside (ex. resin, air, vacuum etc.). Then, since a difference in the refractive index therebetween would be increased at the boundary surface, the effect of total reflection can be improved.

Although the intermediate bandgap layers 12 and 20 have an effect to reduce a voltage applied to the emitter, they can be replaced with the other materials such as GaInP etc., each of which has a bandgap between GaAs and AlAs. Further, either a graded layer of which composition is gradually changed or a superlattice layer is also applicable for the bandgap layer.

In the modification, the substrate 10 can be formed to be a p-type substrate, not an n-type. Then, each conduction type of all layer contained in the chip should be reversed, accordingly. Further, the plane-direction of the substrate 10 is not limited to the plane (100) in the embodiment and every plane can be applicable.

Although the material AnZn is used for the top electrode 25 in the above embodiment, the other p-side ohmic electrode can be used therefor. Furthermore, although the material AuGe is used for the bottom electrode 26 in the embodiment, another n-side ohmic electrode can be used therefor.

Finally, although the respective semiconductor layers 11–21 are provided by the MOCVD method, they can be formed by a MBE (molecular beam epitaxial) method, a gas source MBE method, a MOMBE (metal organic MBE) method, a CBE (chemical beam epitaxial) method and so on.

<The Second Embodiment>

Figure 10:
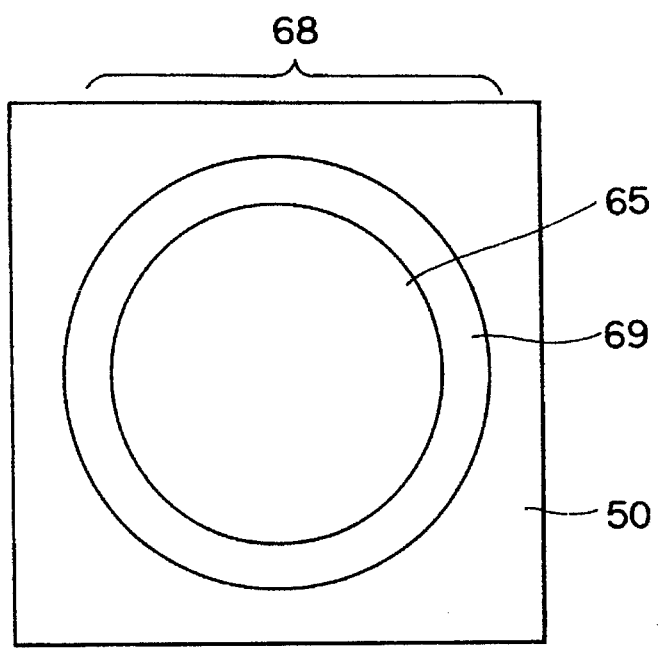
FIG. 10 is a top view of a AlGaInP type of LED in accordance with the second embodiment of the present invention.
Figure 11:
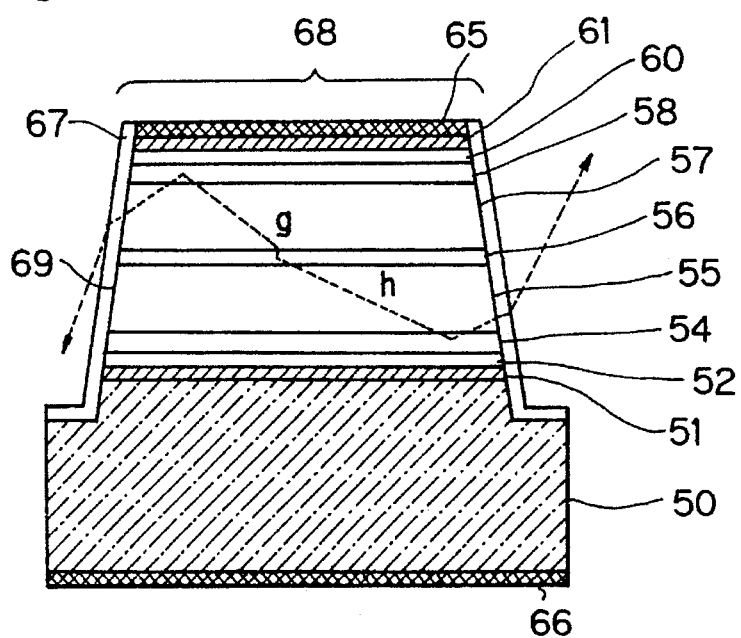
FIG. 11 is a cross-sectional view of the LED of FIG. 10.

FIG. 10 shows a top view of an LED in accordance with the second embodiment of the invention, while FIG. 11 shows a cross-sectional view thereof.

The shape of sides of the LED element in the second embodiment is not a rectangular parallelepiped but is formed to be a conical shape with its top portion severed.

The LED in the second embodiment is manufactured as follows. By the MOCVD method, an n-type GaAs buffer layer 51(0.5 μm), an n-type GaInP intermediate bandgap layer 52(0.2 μm), an n-type. AlInP total-reflection layer 54(1 μm), an n-type AlGaInP(y=0.7) cladding layer 55(25 μm), an undoped AlGaInP(y=0.5) emitting layer 56(1 μm), a p-type AlGaInP(y=0.7) cladding layer 57(25 μm), a p-type AlInP total reflection layer 58(1 μm), a p-type GaInP intermediate bandgap layer 60(0.2 μm) and a p-type GaAs contact layer 61(1 μm) are formed in order on an n-type GaAs substrate 50 of which a top surface consists of a (100) direction plane.

Next, a top electrode 65 and a bottom electrode 66 are deposited in vapor all over the top and bottom surfaces, respectively. Thereafter, by means of a wet-etching process, a resist pattern of 100 μmϕ is formed on the top surface 65 and then the respective layers from the top electrode 65 through the substrate 50 are etched to form a groove of 50 μm in depth. By this etching, slightly inclined side surfaces 69 are formed and mesa structure 68 of 100 μmϕ is obtained.

Thereafter, $SiO_2$ protection films 67 are formed on the side surfaces 69. Note, at that time, since the protection films 67 extend also up to the top electrode 65, the excessive protection films 67 spreading on the top electrode 65 are eliminated by etching after covering the side surfaces 69 with the resist.

Figure 12:
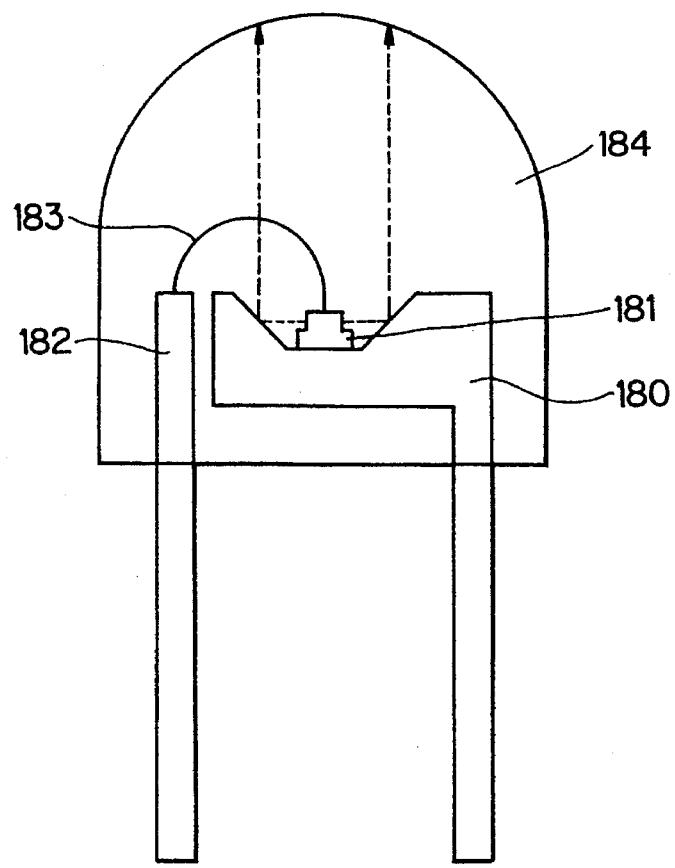
FIG. 12 is a cross-sectional view in which the LED of FIG. 10 is molded in a resin.

Next, the structure is divided into chips at intervals of 140 μm by dicing. Then, as shown in FIG. 12, after Ag-paste is painted on a stem 180, the chip is pasted on the stem 180 so that the bottom electrode 66 is arranged to come an underside of the chip. Thereafter, the top electrode 65 is connected to a lead 182 through a wire 183 and then the whole stem is sealed with a resin 184.

The light radiated from the light emitting layer 56 radiates from either the side surfaces directly or those indirectly after being reflected by the total reflection layers 53, 54, 58 and 59 as shown with beams g and h of FIG. 11. As shown by dotted lines in FIG. 12, these beams are reflected by the side surfaces of the stem 180 to thereby radiate from the front surface of the resin 184.

There are three reasons why the mesa configuration 68 is provided before dicing. First, the outer radiation efficiency can be increased by its conical shape in comparison with that of a square column. Second, no damage due to dicing is caused on the side surfaces, whereby the reliability is improved. Third, the protection films 67 can be formed.

The mesa configuration 68 can be any of shapes besides its conical shape, such as an octagonal pyramid, a hexagonal pyramid, a square pyramid, a triangular pyramid, and so on. In this configuration, the side surfaces 69 are slightly inclined against the substrate 50; nevertheless, the side surfaces 69 can be vertically formed. In the above-mentioned process, although the etching to form the mesa configuration 68 is executed after forming the top electrode 65 and the bottom electrode 66, it can be executed therebefore. Further, the etching method can be a RIBE (reactive ion beam etching) method.

The protection films 67 serve to prevent the electricity from leaking from the side surfaces and to prevent the semiconductor crystal constituting the LED from deteriorating. However, if a product of the layer thickness and the refractive index is set to be ¼ of the emitting wavelength, the films can also operate as films for preventing the reflection, so that the light radiation efficiency can be increased.

Besides the material $SiO_2$, the protection film 67 can be made of a dielectric material, such as alumina, silicon nitride and others. Regarding the forming method thereof, there are a vacuum evaporating method, a sputtering method, and so on. Further, AlGaAs, AlGaInP and other semiconductor films are applicable for the protection film 67. Note, in this case, it is preferable that the forming of the semiconductor film is carried out before forming the top electrode 65 and the bottom electrode 66. The resin can be employed for the film 67.

The LED chip in accordance with the embodiment is convenient for a lateral mounting identical to that in the first embodiment since the protection films 67 are applied on the side surfaces 69, particularly.

Regarding other constituents of the chip, modifications similar to those described in the first embodiment are applicable.

<The Third Embodiment>

Figure 13:
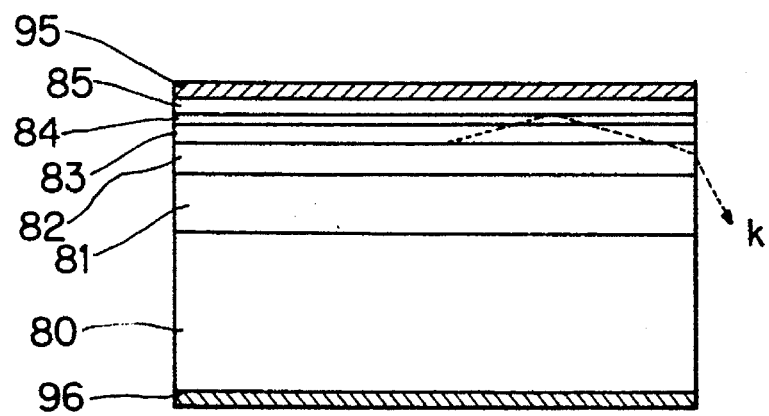
FIG. 13 is a cross-sectional view of a GaAsP type LED in accordance with the third embodiment of the present invention.

FIG. 13 shows a cross-sectional view of a GaAsP type LED in accordance with the third embodiment of the present invention. Note that, through this embodiment, an expression GaAsP stands for $GaAs_{1-x}P_x$.

The LED in the third embodiment is manufactured as follows. By an LPE method, an n-type GaAsP (wherein; x changes from 1 to 0.65 gradually) graded buffer layer 81(25 μm), an n-type GaAsP (x=0.65) layer 82(50 μm), an n-type GaAsP:N (x=0.65) layer 83(20 μm) and an undoped GaP total reflection layer 85(5 μm) are formed in order on an n-type GaP substrate 80 of which a top surface consists of a (111) B direction plane.

Next, charging a light-emitting diode wafer and the element Zn into a quartz tube and sequent heating at 700° C., the element Zn is diffused from the surfaces so that the undoped GaP total reflection layer 85 and an upper portion of the n-type GaAsP:N layer 83 are converted into p-types as to a p-type GaP total reflection layer 85 and a p-GaAsP:N layer 84, respectively. The light emits in the vicinity of the pn junction which is formed at the boundary between the layers 83 and 84. With this process, although the bottom surface of the n-type GaP substrate 80 is converted to a p-type surface, this converted portion is eliminated by grinding.

Thereafter, a top electrode 95 and a bottom electrode 96 are deposited in evaporation on top and bottom surfaces, respectively. Then, the structure is divided into chips at intervals of 250 μm by dicing and the respective LED chips are laterally mounted in the same way as that of the first embodiment.

A broken line K in FIG. 13 shows a condition where the light, which has been radiated from the pn junction emitting area and reflected by the total reflection layer 84 thereafter, is extracted up from the side surface. Since the light, which has been absorbed in the top electrode 95 in the conventional emitter, can be extracted outside by the total reflection layer 85, the high outer radiation efficieny can be provided for the LED.

In principle, the composition of the GaP substrate 80 is identical to that of the total reflection layer 85, whereby the effects of the former are similar to those of the latter. The total reflection layer of the present invention is a thin film for total reflection, which is intensionally arranged in front of the absorption area in a view from the emitting area and accordingly, such a concept has not been disclosed in the prior art.

Note that, in the embodiment, since the compound GaP is different from the compound GaAsP in terms of lattice constant, it prevents lattice defects due to the lattice mismatch from extending up to the light-emitting area by a provision of the GaAsP graded buffer layer of which composition is gradually changed, when growing the GaAsP on the GaP substrate. On the other hand, since the total reflection GaP layer is grown on the GaAsP after the light emitting layer has been formed once, it is hard for the lattice defect to extend up to the light emitting layer even if the graded buffer layer is eliminated. From this point of view, although a graded buffer layer under the total reflection layer is eliminated in the embodiment, it can be inserted therebetween.

Further, although the GaAsP is grown on the GaP substrate in the embodiment, the GaAsP can be grown on a GaAs substrate. It is noted that, generally, the GaP substrate is used for a yellow, orange or red LED in the GaAsP type and that the GaAs substrate is used for a red or infrared LED in the GaAsP type.

Although GaP of a refractive index smaller than that of AlGaAs is employed as a material for the total reflection layer in the shown embodiment, AlGaAs may be used therefor.

Regarding other constituents of the chip, modifications similar to those described in the previously mentioned embodiments are applicable.

<The Fourth Embodiment>

Figure 14:
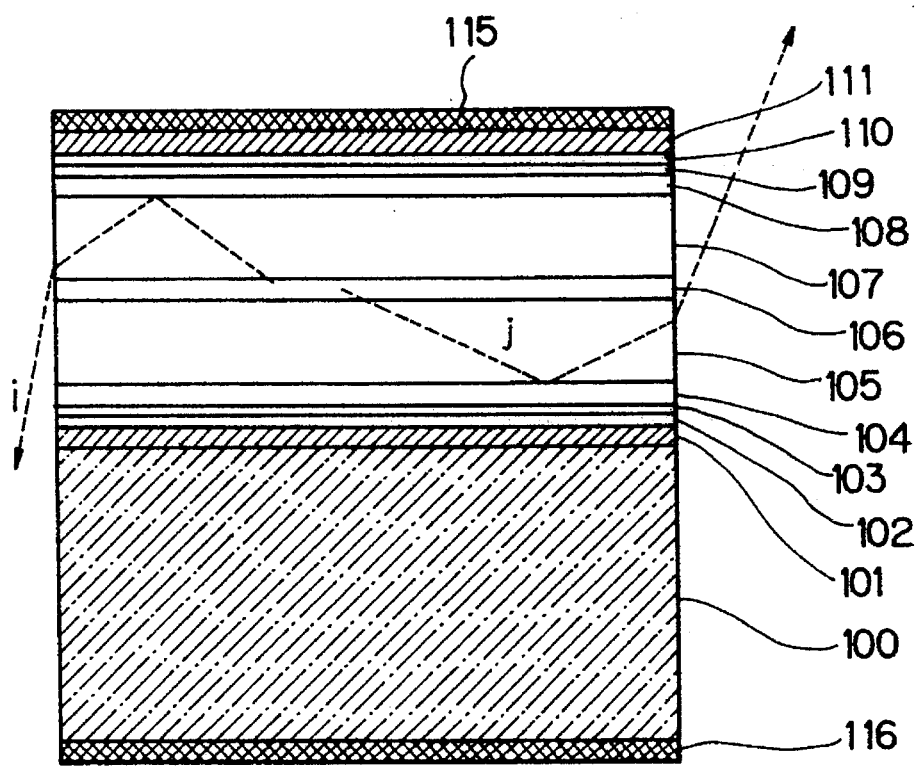
FIG. 14 is a cross-sectional view of a ZnCdSe type LED in accordance with the fourth embodiment of the present invention.

FIG. 14 shows a cross-sectional view of a ZnCdSe type LED thereof in accordance with the fourth embodiment of the present invention. In addition, through this embodiment, an expression ZnCdSe stands for $Zn_{1-x}Cd_xSe$; ZnCdS for $Zn_{1-x}Cd_xS$; and ZnMgSSe for $Zn_{1-x}Mg_xS_ySe_{1-y}$.

The LED in the forth embodiment is manufactured as follows. By the MBE method, an n-type GaAs buffer layer 101(0.5 µm), an n-type $Al_{0.5}Ga_{0.5}As$ first intermediate bandgap layer 102(0.2 µm), an n-type AlAs second intermediate bandgap layer 103(0.2 µm), an n-type ZnCdS reflection layer 104(1 µm), an n-type ZnSSe cladding layer 105(20 µm), an undoped $Zn_{1-x}Cd_xSe$ (x=0.2) strained quantum well emitting layer 106(0.01 µm), a p-type ZnSSe cladding layer 107(20 µm), a p-type ZnCdS reflection layer 108(1 µm), a p-type AlAs second intermediate bandgap layer 109(0.2 µm), a p-type $Al_{0.5}Ga_{0.5}As$ first intermediate bandgap layer 110(0.2 µm) and a p-type GaAs contact layer 111(1 µm) are formed in order on an n-type GaAs substrate 100 and thereafter, a top electrode 115 and a bottom electrode 116 are formed.

Next, the structure is divided into a plurality of chips of 140 µm square by dicing and thereafter, the processes of stem-bonding, wire-bonding and sealing with resin are carried out in order, so that the chips are laterally mounted in the same way as that of the first embodiment.

Broken lines i and j in FIG. 14, show examples of beams radiated from the side surfaces after being emitted in the light emitting layer.

The LED emitter of this embodiment can radiate a blue light of 492 nm in wavelength, which is necessary for the full-color display. The brightness of light is 2.2 times as much as that of the conventional top-radiating type of LED emitter without employing a reflection layer having a total reflection characteristic.

Utilizing a feature that a refractive index of ZnCdS constituting the reflection layers 104 and 108 is smaller than that of ZnSSe constituting the cladding layers 105 and 107, ZnCdS is employed for the reflection layers in the embodiment. Note that, the alloy composition ratio of ZnCdS to ZnSSe is established so as to be in lattice-matched with the GaAs substrate 100.

Regarding this fourth embodiment, a variety of modifications are applicable, as described below.

That is, ZnCdSSe and ZnMgSSe instead of ZnCdS are applicable for the reflection layers 104 and 108.

For the cladding layers 105, 107 each of which is a medium arranged on an incidental side for the total reflection layer, ZnSe or ZnMgSSe may be used instead of ZnSSe. Incidentally, in the case if ZnMgSSe is utilized for the cladding layers 105, 107, it is desirable that also the same composition ZnMgSSe is used for the total reflection layer, and furthermore, that a Mg or S composition ratio thereof is so set as to be larger than that of the cladding layers.

Furthermore, the LED can be formed to be the mesa configuration as shown in the second embodiment.

Although the light-emitting layer 106 is made of ZnCdSe (X=0.2) in the embodiment, a value of X therein is not limitative. For example, the light-emitting layer can be made of ZnSe resulting from X of 0. Further, the light-emitting layer can be of a multiquantum well such as ZnSe/ZnCdSe. The ZnSSe cladding layers 105, 107 of the embodiment can be consisting of ZnS/ZnSe strained super-lattice layers, respectively.

Although the respective semiconductor layers 101–111 are provided by the MBE (molecular beam epitaxial) method, they can be formed by the MOCVD method, the MOMBE method, the gas source MBE method, the CBE (chemical beam epitaxial) method, and so on.

Regarding elements for the respective semiconductor layers 104–108, it is applicable of the II–VI group semiconductors using the elements Cd, Zn, Mg etc., as the II group element and the elements Te, Se, S etc., as the VI group element.

<The Fifth Embodiment>

Figure 15:
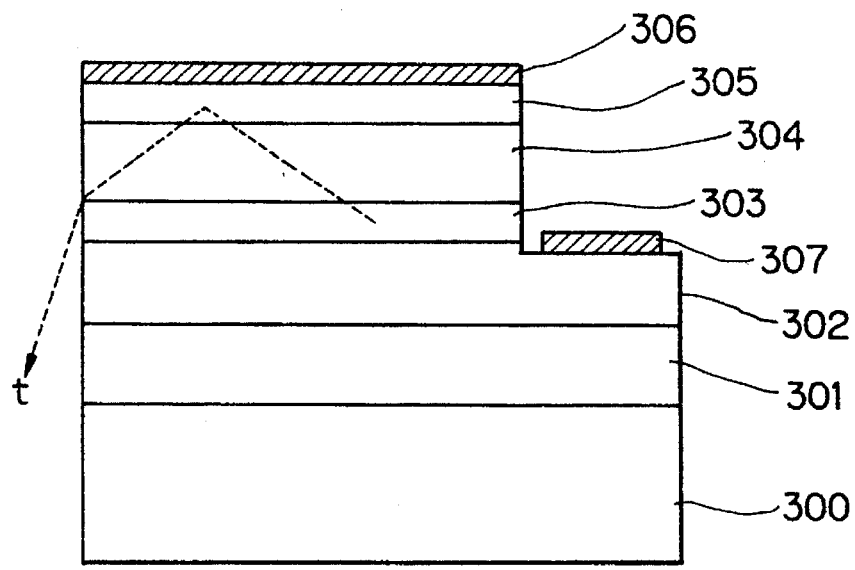
FIG. 15 is a cross-sectional view of a AlGaInN type LED in accordance with the fifth embodiment of the present invention.

FIG. 15 shows a cross-sectional view of an AlGaInN type LED in accordance with the fifth embodiment of the present invention.

An AlN buffer layer 301, an n-type GaN cladding layer 302, an n-type GaInN light-emitting layer 303, a p-type GaN cladding layer 304 and a p-type AlGaN total reflection layer 305 are formed on a sapphire substrate 300 in order, by the MOCVD method. Next, a part of the emitter is etched to expose the n-type GaN cladding layer 302. A p-side Au electrode 306 is formed on the p-type AlGaN total reflection layer 305 and similarly, an n-side Al electrode 307 is formed on the n-type GaN cladding layer 302 exposed by etching. After that, the structure is divided into a plurality of chips of 250 µm square by dicing and then, the processes of mounting to the stem, wire-bonding to the p-side electrode and n-side electrode and sealing with the resin are carried out in order. In such a case, there is a problem that the current is not diffused enough into the p-type GaN cladding layer since it is difficult to reduce a resistance of the p-type GaN layer in the conventional structure. If the current diffusion is insufficient, the light emission is executed mainly under the p-side electrode. Consequently, a light component traveling for the p-side electrode is absorbed by the electrode itself, so that the light cannot be used effectively while a light component traveling for the sapphire substrate can be used effectively. According to the embodiment, however, the light component absorbed in the p-side electrode can be reduced sharply since the p-type total reflection layer 305 is arranged under the p-side electrode. Therefore, for example, it is possible to guide the beam t shown in FIG. 15 to the side surfaces of the LED.

Note that, the present invention can be applicable for a variety of light emitting diode having materials and a structure besides those shown in the previous embodiments.

<The Sixth Embodiment>

Figure 16:
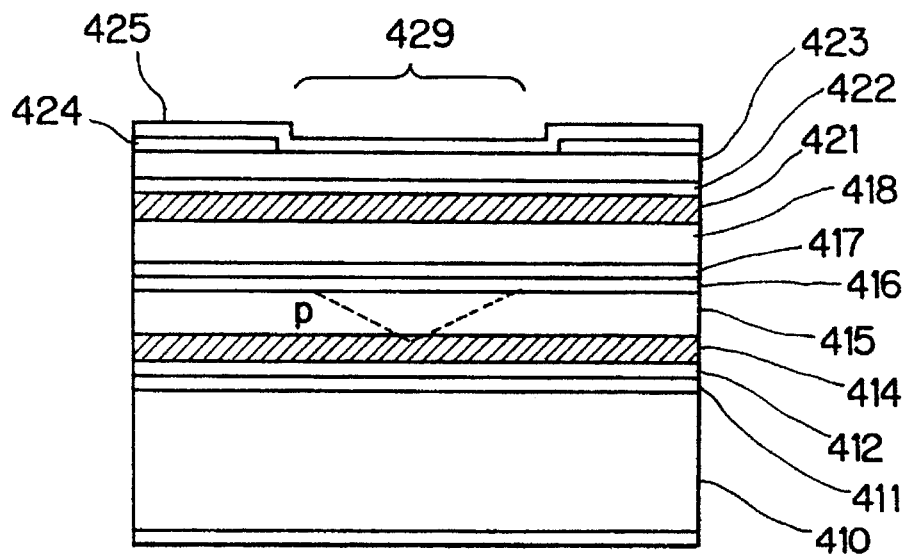
FIG. 16 is a cross-sectional view of a AlGaInP type semiconductor laser in accordance with the sixth embodiment of the present invention.

FIG. 16 shows a cross-sectional view of a semiconductor laser in an AlGaInP type thereof in accordance with the sixth embodiment of the present invention. Note that, in the descriptions hereinafter, each numeral in each parenthesis denotes a thickness of each layer in a direction perpendicular to a surface of substrate thereof. Further, an expression GaInP stands for $Ga_{0.5}In_{0.5}P$; AlInP for $Al_{0.5}In_{0.5}P$; and AlGaInP stands for $(Al_yGa_{1-y})_{0.5}In_{0.5}P$.

The AlGaInP type of semiconductor laser in FIG. 16 is manufactured as follows. By the MOCVD method, an n-type GaAs buffer layer 411(0.5 µm), an n-type $Al_{0.5}Ga_{0.5}As$ intermediate bandgap layer 412(0.2 µm), an n-type AlAs total reflection layer 414(1 µm), an n-type AlGaInP (y=0.7) cladding layer 415(2 μm), an undoped $Ga_{0.62}In_{0.38}P$ strained active layer 416(20 nm), a p-type MQB (multi quantum barrier) layer 417, a p-type AlGaInP (y=0.7) cladding layer 418(2 μm), a p-type AlAs total reflection layer 421(1 μm), a p-type $Al_{0.5}Ga_{0.5}As$ intermediate bandgap layer 422(0.2 μm) and a p-type GaAs contact layer 423(1 μm) are formed in order, on a n-type GaAs substrate 410 of which a top surface consists of a (100) direction plane.

And then, forming an insulating film 424 on a top surface of the laminated structure, an opening 429 having 100 μm in width is formed by etching. Thereafter, forming an electrode 425 on the top surface and the other electrode 426 on a bottom surface, respectively, the structure is cleaved into laser bars of 500 μm in length.

Next, a low reflection film ($Al_2O_3$) 427 (not shown) is formed on a front cleaved surface and a high reflection film ($Al_2O_3/Si/Al_2O_3/SiAl_2O_3$) 428 (not shown) is formed on a rear cleaved surface. Further, the laser bars are divided into a plurality of chips and then, the wire-bonding is carried out after mounting them on the stem. Thereafter, the chip is sealed hermetically for a laser package.

The semiconductor laser of this embodiment oscillates with a central wavelength of 630 nm. Further, the threshold current of the semiconductor laser is reduced to about ½ times as much as that of a semiconductor laser having no total reflection layer since a spontaneous emission light traveling obliquely from the active layer 416 to the total reflection layer 414 or 421 is reflected to return to the active layer.

Also regarding the sixth embodiment, a variety of modifications are applicable, as described below.

AlGaAs, AlInP or AlGaInp instead of the employed compound AlAs can be used for the reflection layers 414 and 421. Each of the total reflection layer can have a layer thickness more than 0.29 μm (=1.41 times of 0.63 μm/3.11; where the value "3.11" is the refractive index of AlAs at 0.63 μm in wavelength).

Although the active layer 416 is constructed as a tensile strain type quantum well layer, it can be any of a compressive strain type quantum well layer, a no-strain type quantum well layer and a multiquantum well layer. Further, although the active layer does not contain the element Al in the above-mentioned embodiment, the layer can contain it in another form.

Although the MQB layer 417, which is a super-lattice layer comprising ten pairs of the compound GaInP layer and the compound AlGaInP (y=0.7) layer, is provided in order to reduce a overflow of electrons from the active layer 416 to the p-cladding layer 418, the layer is not always necessary for the present laser.

Between the active layer 416 and the cladding layer 415 or between the active layer 416 and the MQB layer 417, there can be provided a light guide layer which has a refractive index smaller than that of the active layer and larger than that of the cladding layer.

Although each of the intermediate bandgap layers 412 and 422 have an effect to reduce the voltage applied to the laser, these layers are not always necessary and alternatively, it can be replaced with other material (ex. GaInP etc.) having a bandgap between GaAs and AlAs. Again, it can be either a graded layer of gradually varied composition or a super-lattice layer.

In a modification, the substrate 410 can be formed to be conductivity of p-type, not n-type. In such a case, the conduction type of all layer should be reversed. Further, the plane-direction of the substrate 410 is not limitative to the plane of (100) of the embodiment so that any of directions is applicable.

The top electrode 425 can be constituted by the other p-side ohmic electrodes besides the AuZn electrode. Similarly, the bottom electrode 426 can be constituted by other n-side ohmic electrodes besides the AuGe electrode.

Although the respective semiconductor layers 411–423 are provided by the MOCVD method in the embodiment, they may be formed by the MBE method, the gas source MBE method, the MOMBE method, the CBE (chemical beam epitaxial) method, and so on.

<The Seventh Embodiment>

Figure 17:
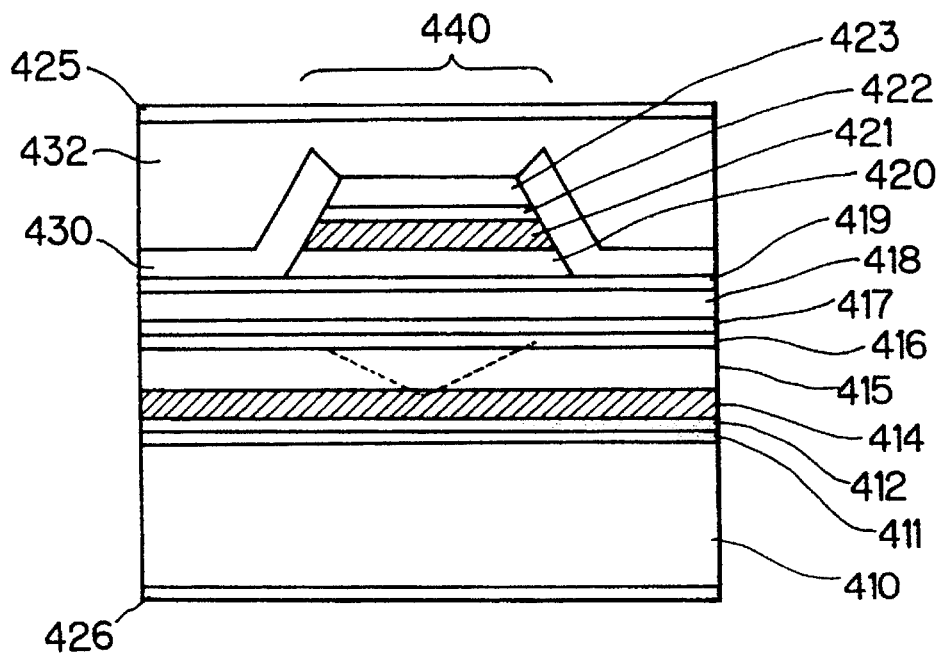
FIG. 17 is a cross-sectional view of a AlGaInP type semiconductor laser in accordance with the seventh embodiment of the present invention.

FIG. 17 shows a cross-sectional view of a semiconductor laser in accordance with the seventh embodiment of the present invention. Note that, because of its similarity to the sixth embodiment, the compounds identical to those in the sixth embodiment are indicated by the same reference numerals.

An AlGaInP type of semiconductor laser in FIG. 17 is manufactured as follows. By the MOCVD method, an n-type GaAs buffer layer 411(0.5 μm), an n-type $Al_{0.5}Ga_{0.5}As$ intermediate bandgap layer 412(0.2 μm), an n-type AlAs total reflection layer 414(1 μm), an n-type AlGaInP (y=0.7) cladding layer 415(2 μm), an undoped $Ga_{0.62}In_{0.38}P$ strained active layer 416(20 nm), a p-type MQB (multi quantum barrier) layer 417, a p-type AlGaInP (y=0.7) first cladding layer 418(2 μm), a p-type GaInP etching stop layer 419 (8 nm), a p-type AlGaInP (y=0.7) second cladding layer 420(0.2 μm), a p-type AlAs total reflection layer 421(1 μm), a p-type $Al_{0.5}Ga_{0.5}As$ intermediate bandgap layer 422(0.2 μm) and a p-type GaAs contact layer 423(1 μm) are formed in order, on an n-type GaAs substrate 410 of which the top surface consists of the (100) direction plane.

Next, forming the insulating film 424 (not shown in the figure) having a width of 4 μm on the top surface of the laminated structure and sequent using the film as a mask, a ridge stripe 440 is formed by etching up to this side of the etching stop layer 419. Next, an n-type GaAs layer 430 is formed by the MOCVD method.

Thereafter, eliminating the insulating film 424, a p-type GaAs layer 432 is formed. Furthermore, forming the electrode 425 on the top surface and the other electrode 426 on the bottom surface, respectively, the structure is cleaved into laser bars of 500 μm in length.

Next, the low reflection film 427 (not shown) is formed on a front cleaved surface and the high reflection film 428 (not shown) is formed on a cleaved rear surface. Further, the laser bars are divided into a plurality of chips and then, the wire-bonding is carried out after mounting them on the stem. Thereafter, the chip is sealed hermetically for the laser package.

Different from the sixth embodiment, the semiconductor laser in accordance with the present embodiment includes a stripe waveguide structure for oscillating in a single transverse mode. Although the maximum light-output of the oscillation laser in the single transverse mode is smaller than that of the broad-area or array type of laser shown in the sixth embodiment, the shape of light beam is so good that it is possible to focus a spot diameter up to a diffraction limit of light, whereby it is suitable for an optical disc, etc.

The semiconductor laser of this embodiment oscillates with a central wavelength of 630 nm. Further, the threshold current of the semiconductor laser is reduced to about ⅔ times as much as that of a semiconductor laser having no total reflection layer since a spontaneously radiated light traveling obliquely from the active layer 416 to the total reflection layer 414 or 421 is reflected to return to the active layer. The reason why the reduction ratio of the threshold current is small in comparison with that of the sixth embodiment is because a part of the total reflection light is returned to outside of the stripe 440, whereby it becomes ineffective.

Of course, modifications similar to those of the sixth embodiment are applicable in this embodiment.

<The Eighth Embodiment>

Figure 18:
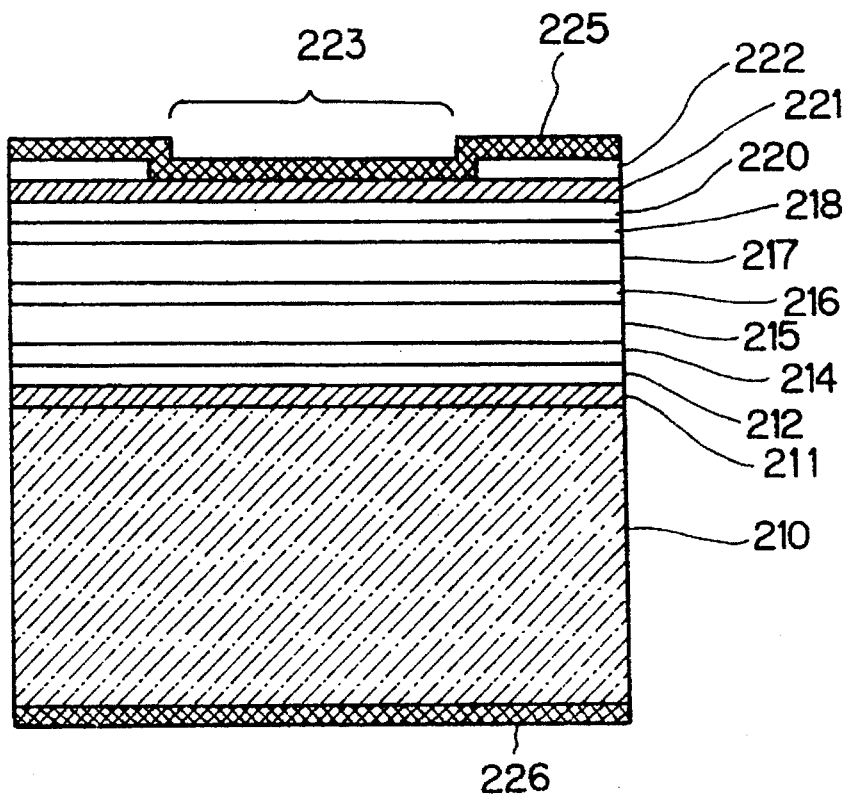
FIG. 18 is a cross-sectional view of a AlGaAs type semiconductor laser in accordance with the eighth embodiment of the present invention.

FIG. 18 shows a cross-sectional view of a semiconductor laser in accordance with the eighth embodiment of the present invention.

By the MBE method, an n-type GaAs buffer layer 211(0.5 µm), an n-type $Al_{0.5}Ga_{0.5}As$ intermediate bandgap layer 212(0.2 µm), an n-type AlAs total reflection layer 214(1 µm), an n-type $Al_{0.5}Ga_{0.5}As$ cladding layer 215(2 µm), an undoped $Al_{0.08}Ga_{0.92}As$ active layer 216(0.05 µm), a p-type $Al_{0.5}Ga_{0.5}As$ cladding layer 217(2 µm), a p-type AlAs total reflection layer 218(1 µm), a p-type $Al_{0.5}Ga_{0.5}As$ intermediate bandgap layer 220(0.2 µm) and a p-type GaAs contact layer 221(1 µm) are formed in order, on an n-type GaAs substrate 210 of which the top surface consists of a (111) B direction plane.

Then, after applying a $Si_3N_4$ film 222 on the surface, a stripe opening 223 having a width of 100 µm and a pitch of 200 µm is formed thereon.

Next, a top electrode 225 and a bottom electrode 226 are deposited in evaporation on the whole top and bottom surfaces of the above structure, respectively. Thereafter, the structure is cleaved at intervals of 400 µm into laser bars. Then, a low reflection film is formed on a front cleaved surface of the bar and a high reflection film is formed on a rear cleaved surface. Further, the bar is divided into a plurality of chips at intervals of 200 µm and then, the wire-bonding is carried out after die-bonding each chip on the stem. Thereafter, the chip is sealed hermetically, whereby the semiconductor laser can be completed.

It has been found that the semiconductor laser of the embodiment has a threshold current of about a half of that of a semiconductor laser having no total reflection layer. Further, an efficiency of oscillation slope exhibits about 1.0 W/A irrespective of the presence of the total reflection layer.

The reason why GaAs of (111) B plane is employed is because the plane can provide a lower threshold current than that of a substrate having a plane of (100). It should be noted that, however, a sort of the substrate is not limitative to that of the embodiment.

<The Ninth Embodiment>

Figure 19:
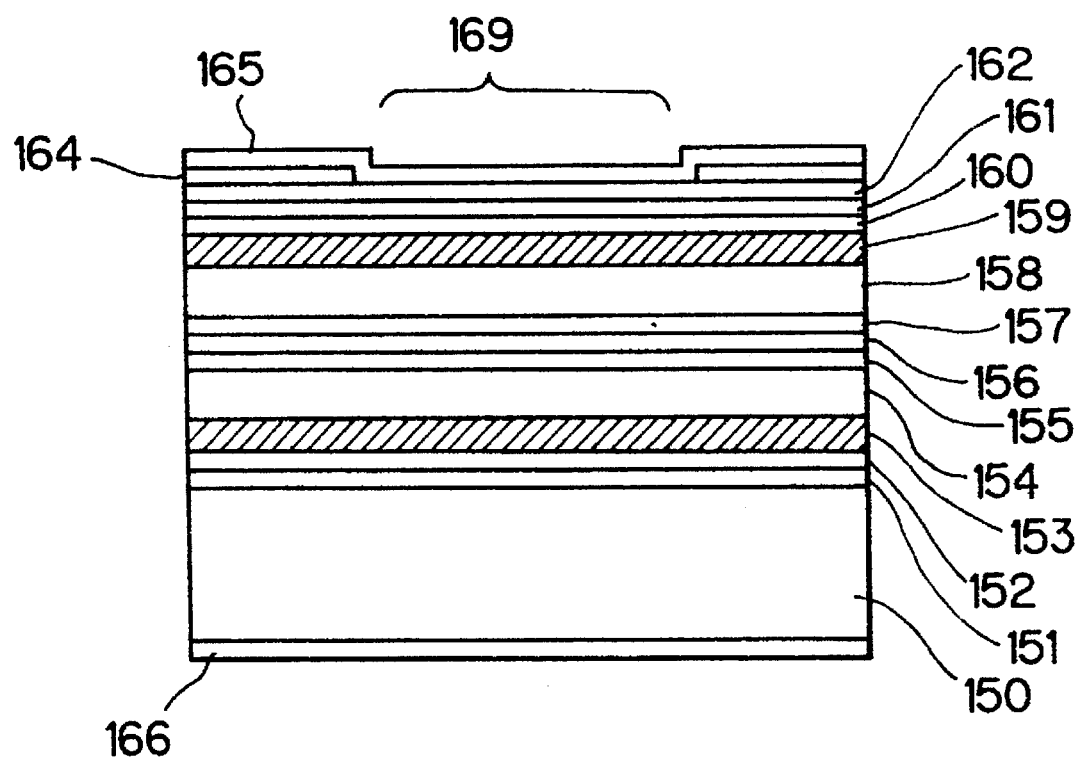
FIG. 19 is a cross-sectional view of a ZnMgSSe type semiconductor laser in accordance with the ninth embodiment of the present invention.

FIG. 19 shows a cross-sectional view of a semiconductor laser in accordance with the ninth embodiment of the present invention. Note that, an expression ZnCdSe stands for $Zn_{1-x}Cd_xSe$; ZnSSe for $ZnS_ySe_{1-y}$; and ZnMgSSe stands for $Zn_{1-x}Mg_xS_ySe_{1-y}$.

By the MBE method, an n-type GaAs buffer layer 151(0.5 µm), an n-type ZnSSe buffer layer 152(0.2 µm), an n-type ZnMgSSe total reflection layer 153(1 µm), an n-type ZnMgSSe cladding layer 154(1 µm), an n-type ZnSSe light guide layer 155(0.1 µm), an undoped $Zn_{1-x}Cd_xSe(x=0.2)$ strained quantum well active layer 156(0.01 µm), a p-type ZnSSe light guide layer 157(0.1 µm), a p-type ZnMgSSe cladding layer 158(1 µm), a p-type ZnMgSSe total reflection layer 159(0.5 µm), a p-type ZnSSe contact layer 160(1 µm), a p-type $ZnSe_{1-x}Te_x$ graded contact layer 161(x:0 to 0.5; 1 µm) and a p-type $ZnSe_{0.5}Te_{0.5}$ contact layer 162(1 µm) are formed in order, on an n-type GaAs substrate 150.

After applying a $Si_3N_4$ film 164 on a surface, a stripe opening 169 having a width of 100 µm and a pitch of 200 µm is formed thereon and then a top electrode 165 and a bottom electrode 166 are formed on the top and bottom surfaces of the above structure, respectively. Thereafter, the structure is cleaved at intervals of 300 µm and furthermore a low reflection film (not shown) is formed on a front side of the cleavage surfaces and a high reflection film (also, no shown) on a rear side of the cleavage surfaces.

Note, the composition ratio of ZnMgSSe of the cladding layers 145 and 158 is set to x=0.08 and y=0.18 and the composition ratio of ZnMgSSe of the total reflection layers 153 and 159 is set to x=0.24 and y=0.4 in such manner that a refractive index thereof is smaller than that of the former layers, except that these composition ratios are set to be in lattice-matched with the GaAs substrate 150.

Regarding this embodiment, the following changes are applicable.

That is, such a stripe configuration as described in the seventh embodiment can be provided to this structure.

Although the respective semiconductor layers 151–162 are provided by the MBE method in the embodiment, they can be formed by the MOCVD method, the gas source MBE method, the MOMBE method, the CBE method, and so on.

Although there is not a detailed description in embodiments hereat, it is possible to carry out the photon recycle due to the total reflection layer in the InGaAsP type semiconductor laser. At present, an investigation of semiconductor laser has been developed using AlGaInN materials. Therefore, the total reflection layer of the invention can be incorporated into such materials. Note that, although the first to ninth embodiments are employing the structure wherein the electrodes are formed on both top and bottom surfaces, the total reflection layer of the invention is applicable for such a known semiconductor laser that both positive and negative electrodes are arranged on the same side of either the top surface or the bottom surface. In such a semiconductor laser as both positive and negative electrodes are provided in only one surface, it is not necessary that the conductive type of the total reflection layer is the same as that of the cladding layer which is adjacent thereto.

Of course, the present invention can be applied for other semiconductor lasers of different materials and structures besides those described in the above embodiments.

As apparent from the foregoing, according to the present invention, it is possible to attain a high outer radiation efficiency or a low oscillation threshold current with a simple and compact constitution in the semiconductor light emitter such as a light-emitting diode and a semiconductor laser, etc.

More specifically, in case of the LED, since the light, which has been absorbed in the opaque layer after entering obliquely thereto, can be picked up from the side surfaces of the LED chip by arranging the total reflection layer between the transparent layer and the opaque layer, it is possible to attain a high outer radiation efficiency with the simple and compact constitution. Furthermore, since the light can be picked up mainly from the side surfaces of the chip, it is convenient to mount the LED chip on the printed board in the lateral arrangement.

Accordingly, the present invention contributes considerably to the improvements in brightness, efficiency and productivity of such light-emitting diodes as the AlGaInP type, AlGaAs type, GaAsP type, II–VI group type and the AlGaInN type.

In case of the semiconductor laser, by arranging the total reflection layer between the cladding layer and the opaque layer and by carrying out the photon recycle to return the spontaneously emitted light, which has not contributed to the laser-oscillation conventionally, to the active layer, it is possible to provide a semiconductor laser with a low threshold current and a high efficiency.

Accordingly, the present invention contributes considerably to the reduction of threshold current level and the improvement in efficiency of such semiconductor lasers as the AlGaInP type, the AlGaAs type and the II–VI group type.

What is claimed is:

1. A semiconductor light emitter having a structure in which a light emitting area or an active layer; a transparent layer which is pervious to light radiated from said light emitting area or said active layer; and an opaque layer or an opaque substrate which is impervious to said radiated light are arranged in order or in the inverse order and wherein the semiconductor light emitter is a light-emitting diode, comprising:

a total reflection layer arranged between said transparent layer and said opaque layer so as to come into contact with said transparent layer, a refractive index of said total reflection layer being smaller than that of said transparent layer;

wherein at least one part of light which has been radiated from said light-emitting area or said active layer and which has been reflected by said total reflection layer thereafter, is either radiated outward from side surfaces of said transparent layer or returned to said active layer; and said transparent layer further comprising of either GaN or AlGaInN and said total reflection layer further comprising of AlGaInN of which refractive indexes are lower than that of said transparent layer, respectively.

* * * * *